(12) United States Patent
Lin

(10) Patent No.: US 12,117,733 B2
(45) Date of Patent: Oct. 15, 2024

(54) METHOD FOR MEASURING CRITICAL DIMENSION

(71) Applicant: NANYA TECHNOLOGY CORPORATION, New Taipei (TW)

(72) Inventor: Chia-Chung Lin, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 507 days.

(21) Appl. No.: 17/584,889

(22) Filed: Jan. 26, 2022

(65) Prior Publication Data

US 2023/0236514 A1 Jul. 27, 2023

(51) Int. Cl.
*G03F 7/00* (2006.01)
*G03F 7/16* (2006.01)

(52) U.S. Cl.
CPC .......... *G03F 7/70625* (2013.01); *G03F 7/168* (2013.01); *G03F 7/70608* (2013.01); *G03F 7/70655* (2023.05)

(58) Field of Classification Search
USPC ......................................................... 430/30
See application file for complete search history.

(56) References Cited

U.S. PATENT DOCUMENTS

| 5,989,763 A | * | 11/1999 | Bendik | ............... | G03F 7/70558 |
| | | | | | 430/311 |
| 2009/0075180 A1 | | 3/2009 | Shin | | |
| 2013/0171571 A1 | | 7/2013 | Dunn et al. | | |
| 2018/0144936 A1 | | 5/2018 | Cho et al. | | |
| 2019/0384172 A1 | | 12/2019 | Chen et al. | | |

FOREIGN PATENT DOCUMENTS

| CN | 110609443 A | 12/2019 |
| TW | 200741810 A | 11/2007 |
| TW | 201202849 A | 1/2012 |
| TW | 201837622 A | 10/2018 |
| TW | 201947680 A | 12/2019 |
| TW | 202010763 A | 3/2020 |
| TW | 202037907 A | 10/2020 |
| TW | 202101582 A | 1/2021 |
| TW | 202128970 A | 8/2021 |
| TW | 202144915 A | 12/2021 |

* cited by examiner

*Primary Examiner* — Christopher G Young
(74) *Attorney, Agent, or Firm* — MUNCY, GEISSLER, OLDS & LOWE, P.C.

(57) ABSTRACT

The present application discloses a method for measuring critical dimension. The method for measuring critical dimension includes providing a substrate; forming a resist layer over the substrate; monitoring a volatile byproduct evolved from the resist layer to obtain a first amount of the volatile byproduct; exposing the resist layer to a radiation source; heating the resist layer; monitoring the volatile byproduct evolved from the resist layer to obtain a second amount of the volatile byproduct; and deducting the critical dimension according to a difference between the first amount of the volatile byproduct and the second amount of the volatile byproduct.

10 Claims, 16 Drawing Sheets

METHOD FOR MEASURING CRITICAL DIMENSION

TECHNICAL FIELD

The present disclosure relates to a method for measuring critical dimension, and more particularly, to a non-destructive method for measuring the critical dimension.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for measuring critical dimension including providing a substrate; forming a resist layer over the substrate; monitoring a volatile byproduct evolved from the resist layer to obtain a first amount of the volatile byproduct; exposing the resist layer to a radiation source; heating the resist layer; monitoring the volatile byproduct evolved from the resist layer to obtain a second amount of the volatile byproduct; and deducting the critical dimension according to a difference between the first amount of the volatile byproduct and the second amount of the volatile byproduct.

Another aspect of the present disclosure provides a method for measuring critical dimension including providing a substrate; forming a resist layer over the substrate; exposing the resist layer to a radiation source; heating the resist layer; continuously monitoring a volatile byproduct evolved from the resist layer from a first time point after forming the resist layer over the substrate to a second time point after heating the resist layer, to obtain a concentration curve of the volatile byproduct; and deducting the critical dimension according to an integration of the concentration curve between the first time point and the second time point.

Another aspect of the present disclosure provides a method for measuring critical dimension including providing a substrate; forming a resist layer over the substrate and including a solvent, a nonactivated polymer resin, a photoacid generator, and a photosensitizer generator; exposing the resist layer to a radiation source in a first wavelength; exposing the resist layer to a radiation source in a second wavelength different from the first wavelength; heating the resist layer; continuously monitoring a volatile byproduct evolved from the resist layer from a first time point after forming the resist layer over the substrate to a second time point after heating the resist layer, to obtain a concentration curve of the volatile byproduct; and deducting the critical dimension according to an integration of the concentration curve between the first time point and the second time point. The photosensitizer generator is sensitive to the second wavelength and the photoacid generator is not sensitive to the second wavelength.

Due to the design of the method for measuring critical dimension of the present disclosure, the critical dimension of the real pattern may be measured without any damage by monitoring the volatile byproduct evolved from the resist layer. Furthermore, no dummy mark for metrology is needed. Those areas previously occupied by the dummy marks for metrology may be saved. As a result, more real estate may be provided for functional circuits so that the cost may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
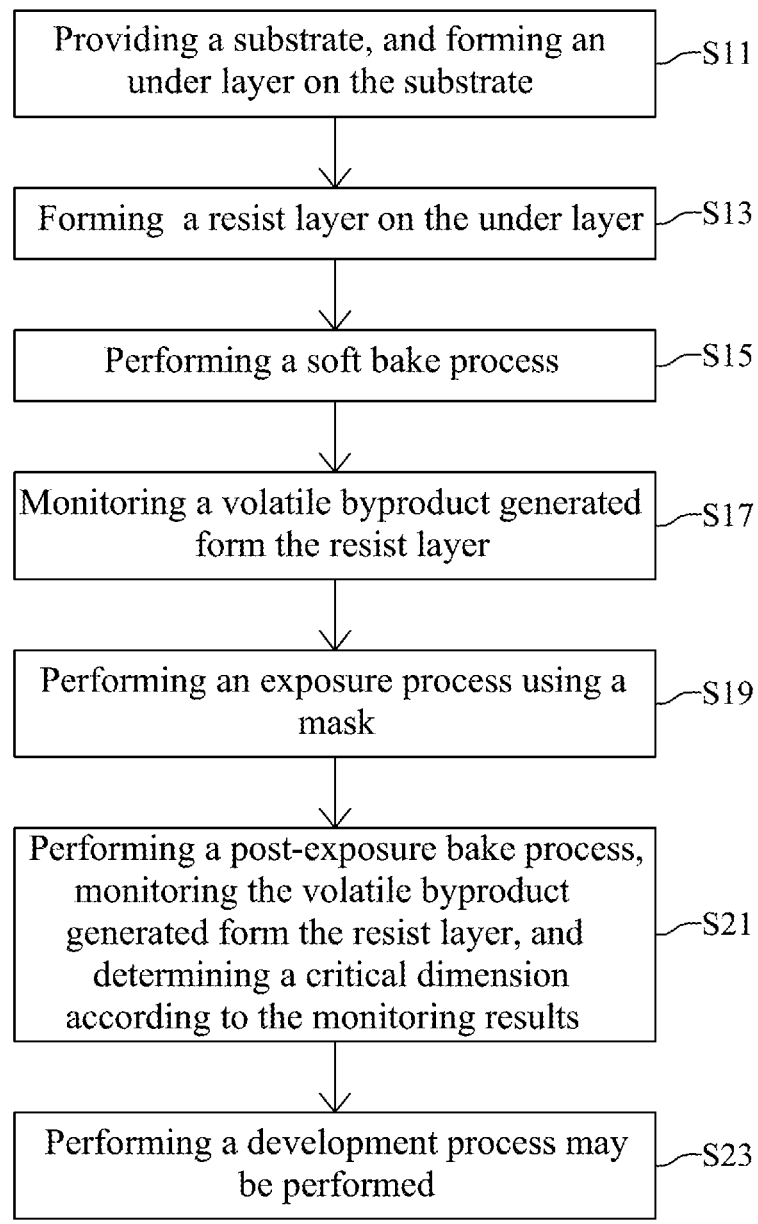
FIG. 1 illustrates, in a flowchart diagram form, a method for measuring critical dimension of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for measuring critical dimension of a semiconductor device 1A in accordance with one embodiment of the present disclosure. FIGS. 2 to 5 illustrate, in schematic cross-sectional view diagrams, part of a flow for measuring the critical dimension of the semiconductor device 1A in accordance with one embodiment of the present disclosure. FIG. 6 shows an exemplary photoacid concentration profile in FIG. 5 in accordance with one embodiment of the present disclosure.

Figure 2:
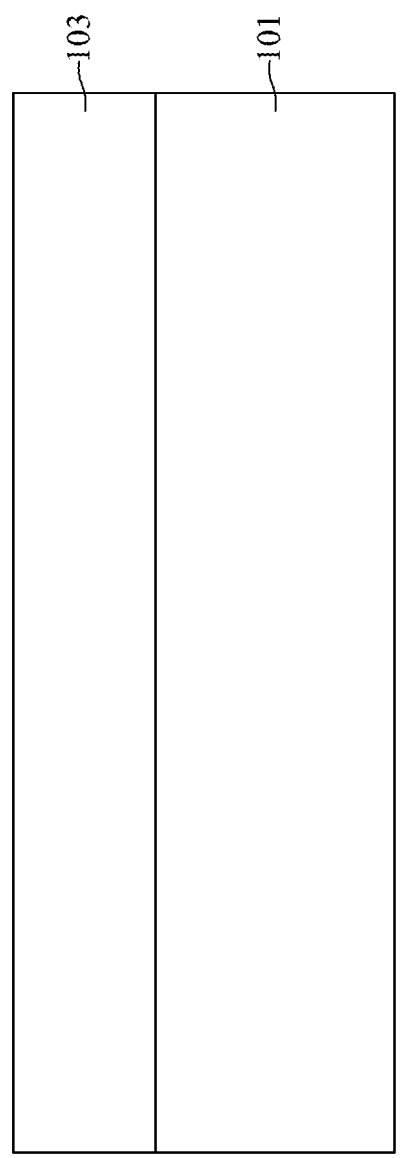
FIGS. 2 to 5 illustrate, in schematic cross-sectional view diagrams, part of a flow for measuring the critical dimension of the semiconductor device in accordance with one embodiment of the present disclosure.

With reference to FIGS. 1 and 2, at step S11, a substrate 101 may be provided and an under layer 103 may be formed on the substrate 101.

With reference to FIG. 2, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the term "substrate" and "wafer" are used interchangeably, both referring to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

In some embodiments, a plurality of device elements (not shown for clarity) may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the under layer 103 may be formed on the substrate 101. The under layer 103 may be a blanket layer to be patterned. For example, the under layer 103 may be a dielectric layer, a barrier layer, an adhesion layer, or an etch stop layer. The dielectric layer may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The conductive features may be electrically coupled to the device elements.

In some embodiments, the under layer 103 may include conductive features (not shown for clarity). The conductive features may include interconnect layers and conductive vias. The conductive features may electrically couple to the device elements. In some embodiments, the conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the device elements and the conductive features may together configure functional units in the first substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

Figure 3:
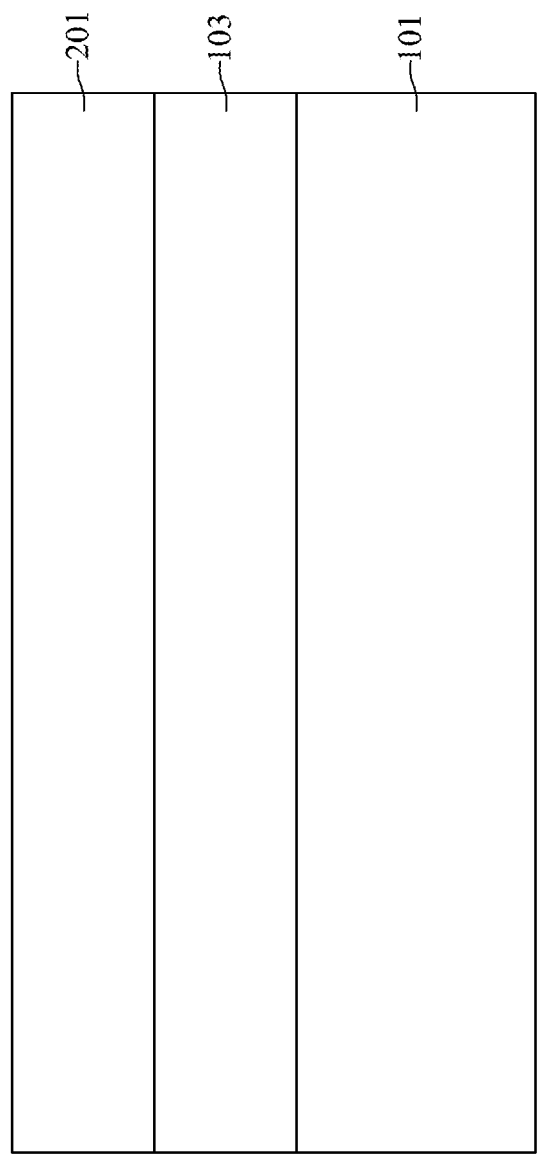

With reference to FIGS. 1 and 3, at step S13, a resist layer 201 may be formed on the under layer 103.

With reference to FIG. 3, the resist layer 201 may be, for example, a top coat barrier layer, a top coat antireflective layer, a bottom antireflective layer, an imaging layer (photoresist), or a sacrificial and barrier layer (hard mask) for etch stopping. In some embodiments, the resist layer 201 may include a solvent, a nonactivated polymer resin, and a photoacid generator (PGA). In some embodiments, the resist layer 201 may further include a crosslinking agent, dye, or other additive.

In some embodiments, the resist layer 201 may be formed by a spin-coating process. Detailedly, during the spin-coating process a resist mixture within a solvent carrier may be dispensed onto the surface of the under layer 103 as the intermediate semiconductor device illustrated in FIG. 2 is rapidly spun. The intermediate semiconductor device is spun until the solvent carrier is substantially removed and the resist mixture may dry as a film of uniform thickness over the entire surface of the under layer 103. The resist mixture may include the nonactivated polymer resin, and the photoacid generator. In some embodiments, the resist mixture may further include the crosslinking agent, dye, and/or other additive. In some embodiments, the solvent carrier may include, for example, propylene glycol monomethyl ether acetate, water, or volatile amine-containing compounds.

The nonactivated polymer resin and the photoacid generator may together configure a chemically amplified photoresist system. Generally, the photoacid generator may be exposed to a radiation source and be turned into a photoacid. The photoacid then triggers an activation reaction involving the nonactivated polymer resin.

In the case of a positive chemically amplified photoresist system, the photoacid catalyzes the deprotection of blocking groups on the nonactivated polymer resin, increasing the polarity of the resin and hence, its solubility in aqueous base. Thus, the activation reaction for a positive chemically amplified photoresist converts a nonpolar, insoluble polymer resin into a polar, soluble polymer resin.

In the case of a negative chemically amplified photoresist system, the photoacid reacts with a cross-linking agent to trigger cross-linking between adjacent polymer chains. Thus, the activation reaction for a negative chemically amplified photoresist system converts a single-chain, soluble polymer resin into a cross-linked, insoluble polymer resin.

It should be noted that volatile byproducts may be generated (or evolved) in both the positive chemically amplified photoresist system and the negative chemically amplified photoresist system. In some embodiments, the volatile byproducts may include, for example, propylene glycol monomethyl ether acetate, water, carbon dioxide, alcohols, volatile amine-containing compounds, hydrocarbons, aldehydes, vinyl ether, and/or sulfides.

Figure 4:
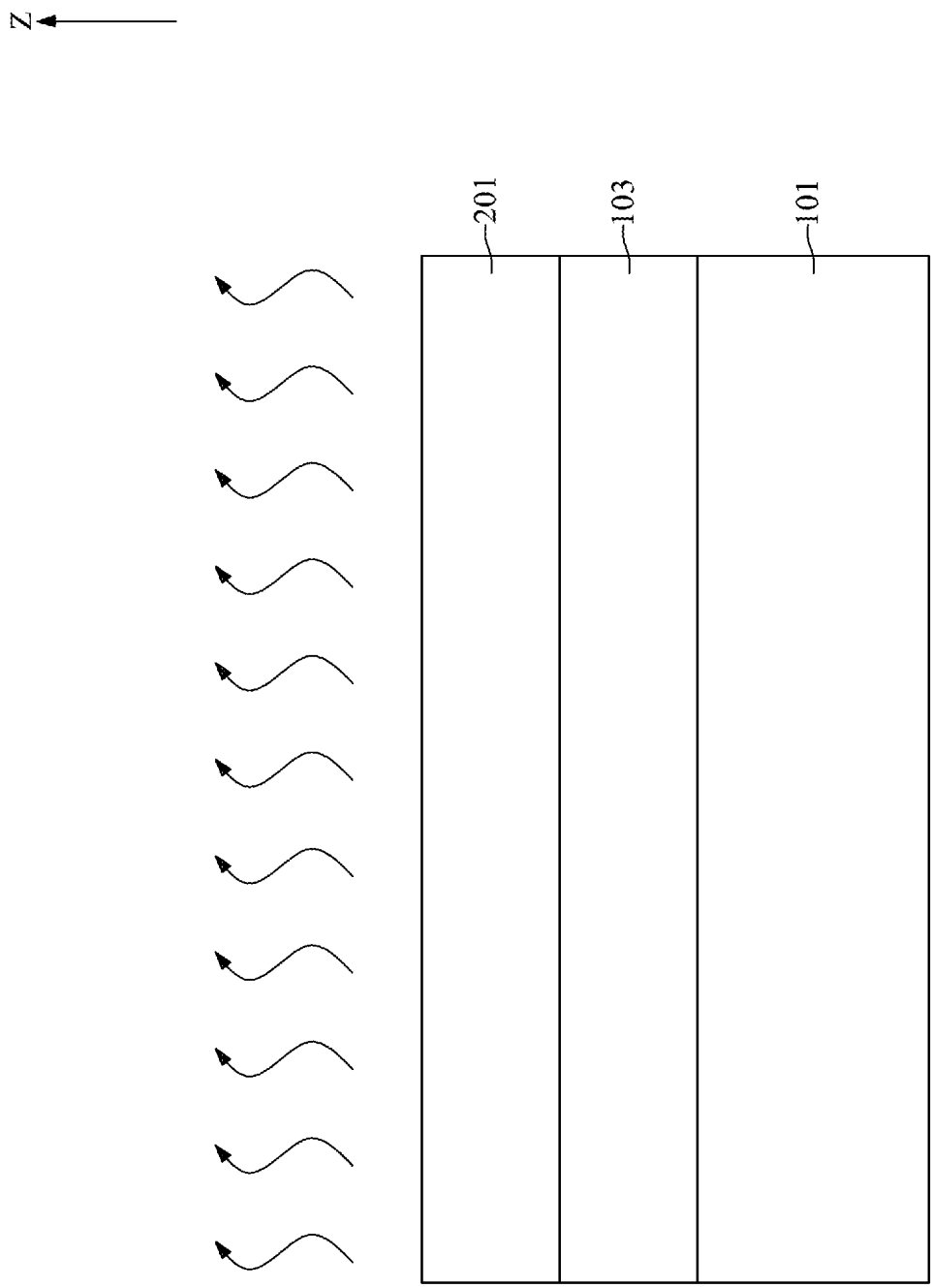

With reference to FIGS. 1 and 4, at step S15, a soft bake process may be performed.

With reference to FIG. 4, during the soft bake process, the intermediate semiconductor device illustrated in FIG. 3 may be heated to approximately the glass-transition temperature Tg of the nonactivated polymer resin, such that additional remaining solvent carrier is removed from the resist layer 201. The curved arrows show that the remaining solvent carrier being removed. The additional remaining solvent carrier may include, for example, propylene glycol monomethyl ether acetate, water, or volatile amine-containing compounds.

With reference to FIGS. 1 and 4, at step S17, a volatile byproduct generated form the resist layer 201 may be monitored.

Figure 9:
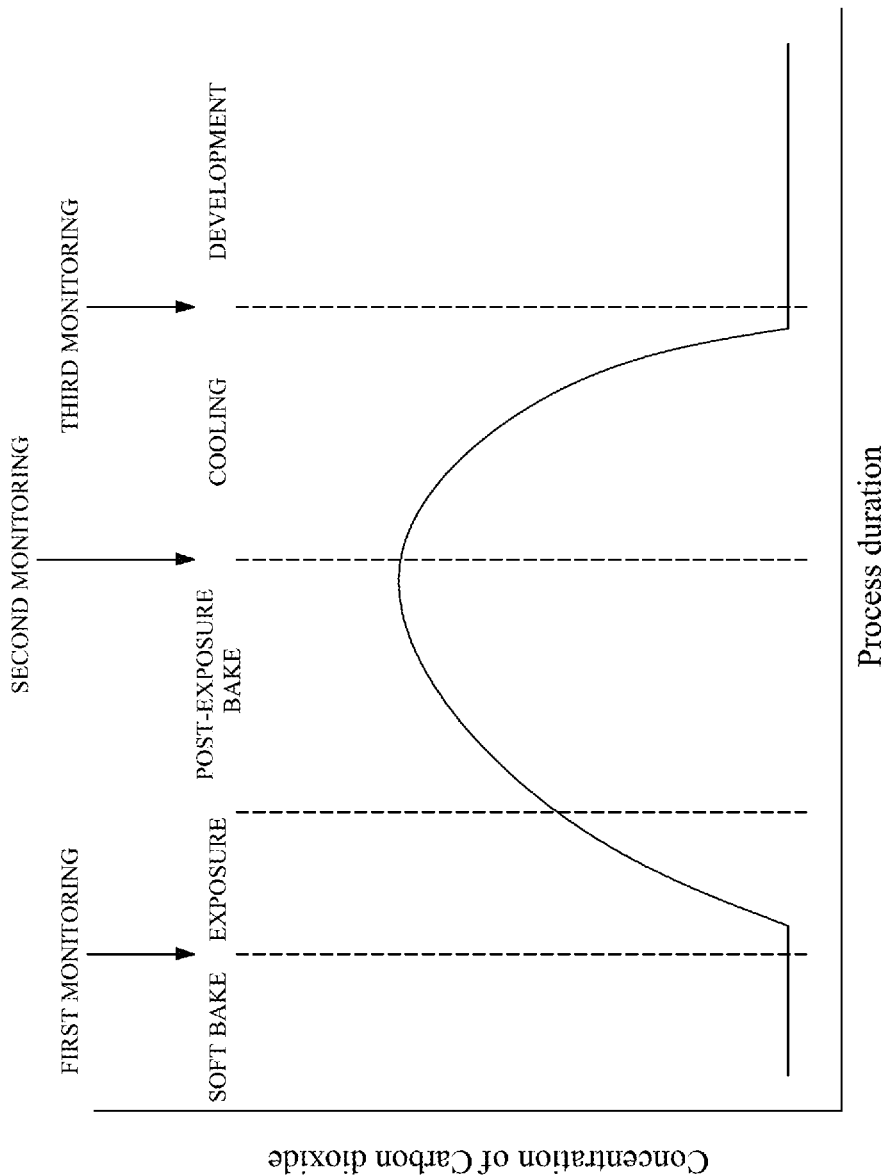
FIG. 9 is a concentration curve representing the volatile byproduct generated form the resist layer measured by a gas analyzer.

With reference to FIG. 4, after the soft bake process, the concentration of volatile byproduct(s) of the chemically amplified photoresist system may be monitored by, for example, a gas analyzer. This timing for monitoring of the volatile byproduct may be referred to as the first monitoring of the volatile byproduct (as shown in FIG. 9).

In some embodiments, the gas analyzer may be, for example, a residual gas analyzer (RGA) which is a familiar device used in vacuum technology for the detection of gas species and their concentrations. The detector of the residual gas analyzer may be any type of mass spectrometer such as a quadrupole mass spectrometer. Generally, the residual gas analyzer may analyze the gases evolved (or generated) from the resist layer 201 (e.g., the volatile byproducts) into the atmosphere inside the process chamber by ionizing a fraction of the gas molecules in each sampled volume, separating the ions by mass, and measuring the quantity of ions at each mass. The residual gas analyzer may rely on a mass sampling technique that monitors only one or more user-selected peaks characteristic of the gases evolving from the resist layer 201. The magnitude of the ion current as measured by the residual gas analyzer may be used to determine the concentration (or partial pressure) of the respective gases evolving from the resist layer 201.

In the present embodiment, carbon dioxide is monitored. It should be noted that carbon dioxide is the byproduct of the chemically amplified photoresist system after exposure to the radiation source. In other words, theoretically, no signal for carbon dioxide may be detected during the first monitoring of the volatile byproduct. The signal obtained during the first monitoring of the volatile byproduct may serve as a baseline.

Figure 5:
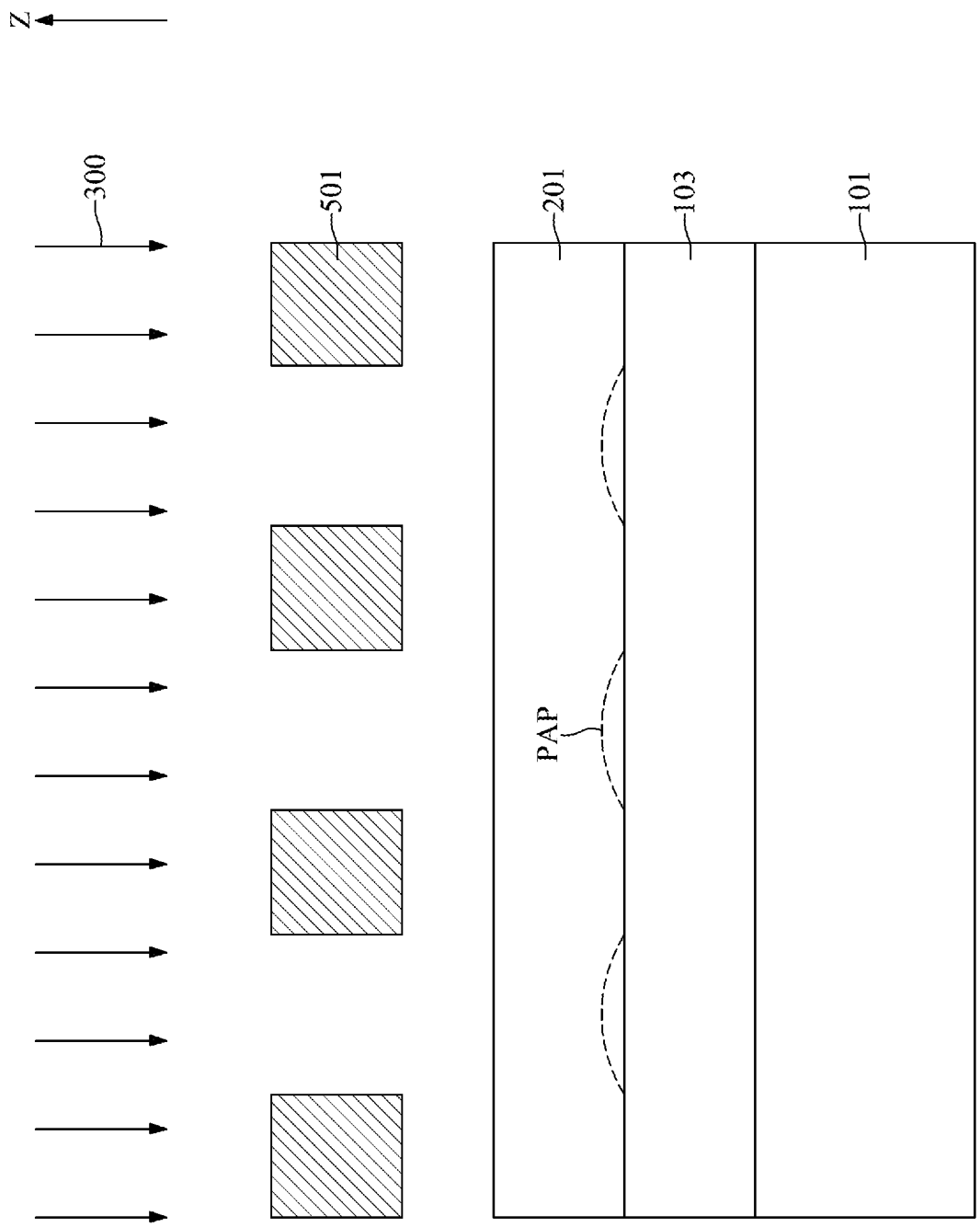
Figure 6:
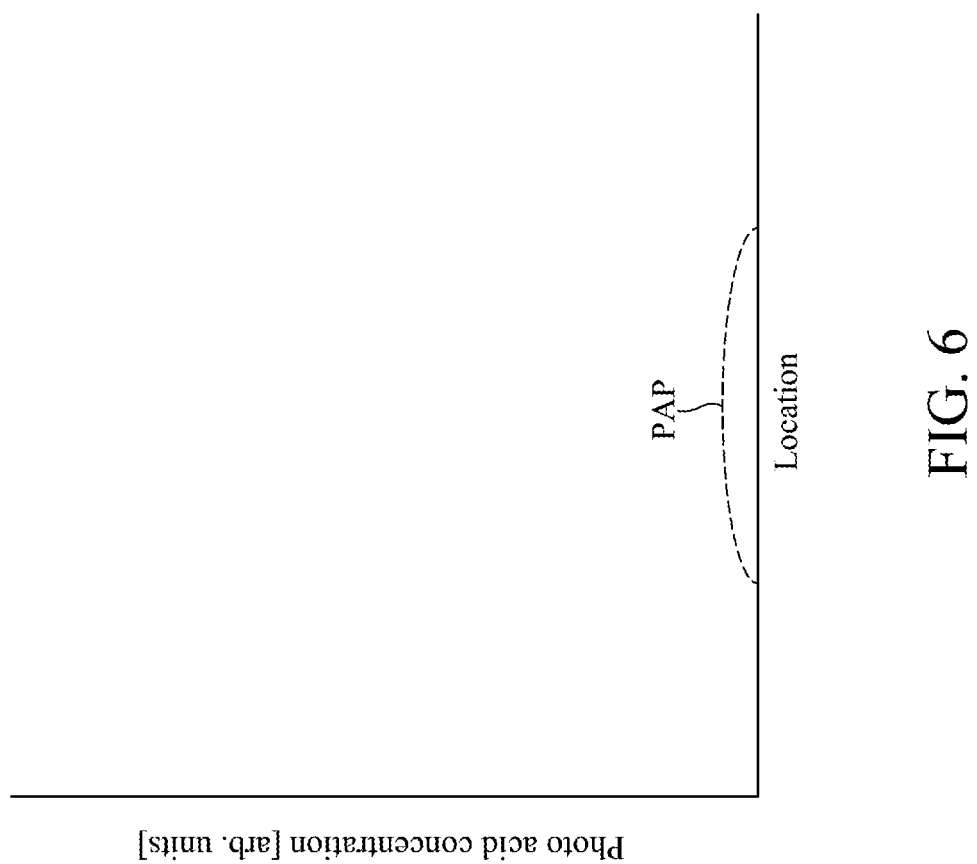
FIG. 6 shows an exemplary photoacid concentration profile in FIG. 5 in accordance with one embodiment of the present disclosure.

With reference to FIGS. 1, 5, and 6, at step S19, an exposure process 300 may be performed using a mask 501.

With reference to FIG. 5, the mask 501 may be aligned to the intermediate semiconductor device illustrated in FIG. 4. The mask 501 may include a pattern to be transferred onto the resist layer 201. After the alignment of the mask 501 and the intermediate semiconductor device, the exposure process 300 may be performed using a radiation source. The radiation source may be, for example, ultraviolet radiation, deep ultraviolet radiation (typically 193 nm or 248 nm), or extreme ultraviolet radiation (typically 13.5 nm). The exposure process 300 may require utilization of complex photolithography equipment (e.g., ArF immersion lithography) and precise masking techniques in order to ensure precise application of radiation only to those portions of the resist layer 201 intended to be exposed.

With reference to FIGS. 5 and 6, during the exposure process 300, photoacid may be generated from the photoacid generator in the exposed regions of the resist layer 201 to form the photoacid concentration profile PAP, which is shown enlarged in FIG. 6. The exemplary reaction of generating photoacid is shown in equation (1).

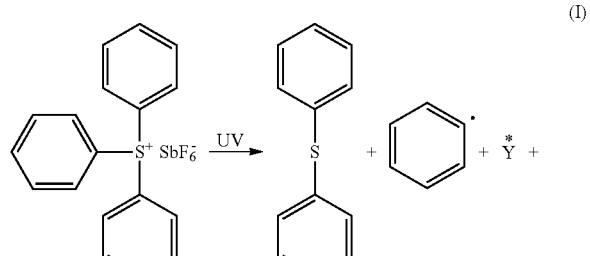

After exposure to the ultraviolet (UV) radiation, the photoacid generator (sulfonium cation) may decompose and provide a proton (photoacid) which can trigger the activation reaction involving the nonactivated polymer resin. The details of the activation reaction will be illustrated later. In some embodiments, gases (i.e., volatile byproducts) may evolve from the resist layer 201 during the exposure process 300. The gases evolved from the resist layer 201 during the exposure process 300 may include, for example, propylene glycol monomethyl ether acetate, water, carbon dioxide, alcohols, hydrocarbons, and/or aldehydes.

Figure 7:
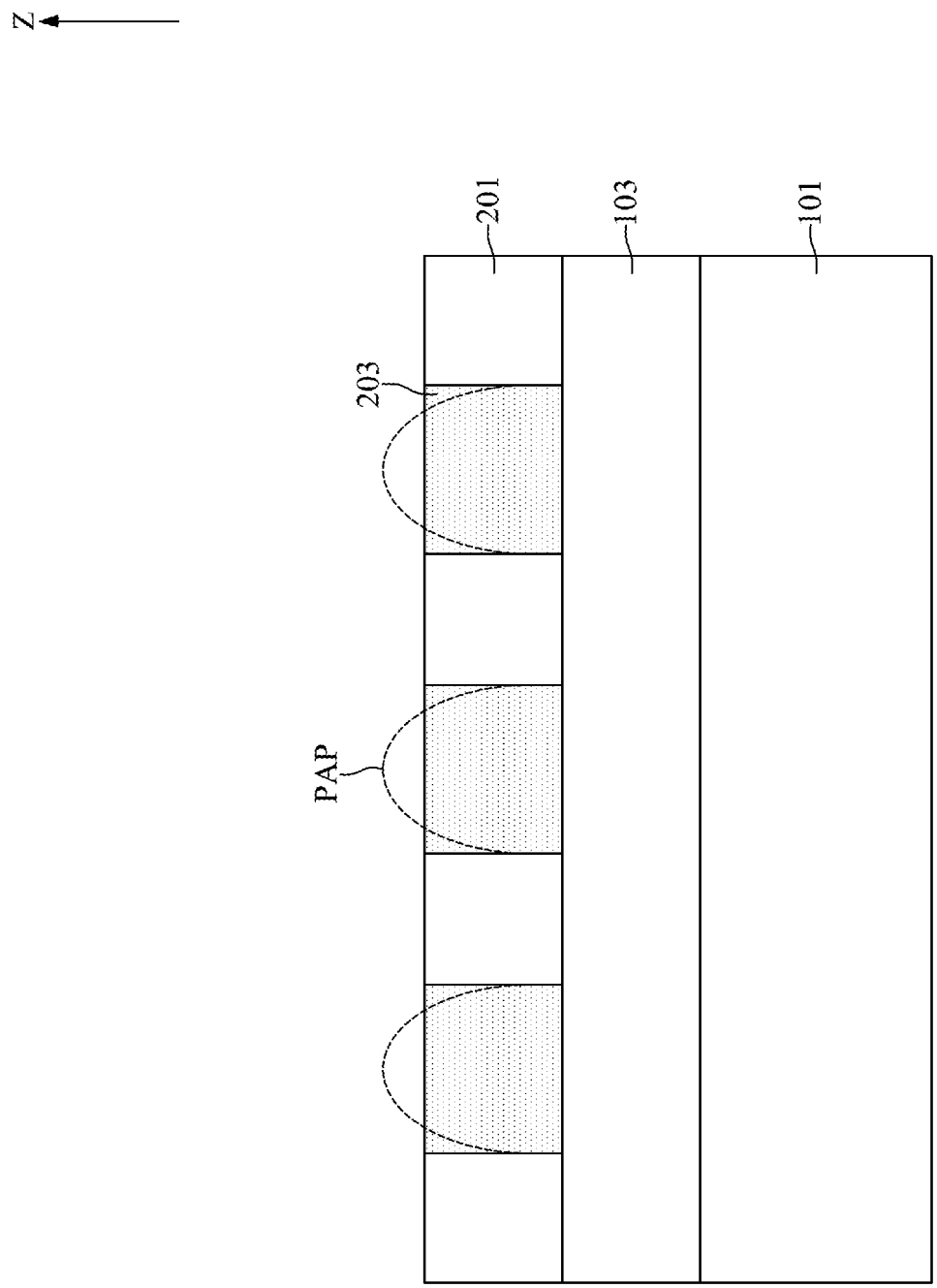
FIG. 7 illustrates, in a schematic cross-sectional view diagram, part of the flow for measuring the critical dimension of the semiconductor device in accordance with one embodiment of the present disclosure.
Figure 8:
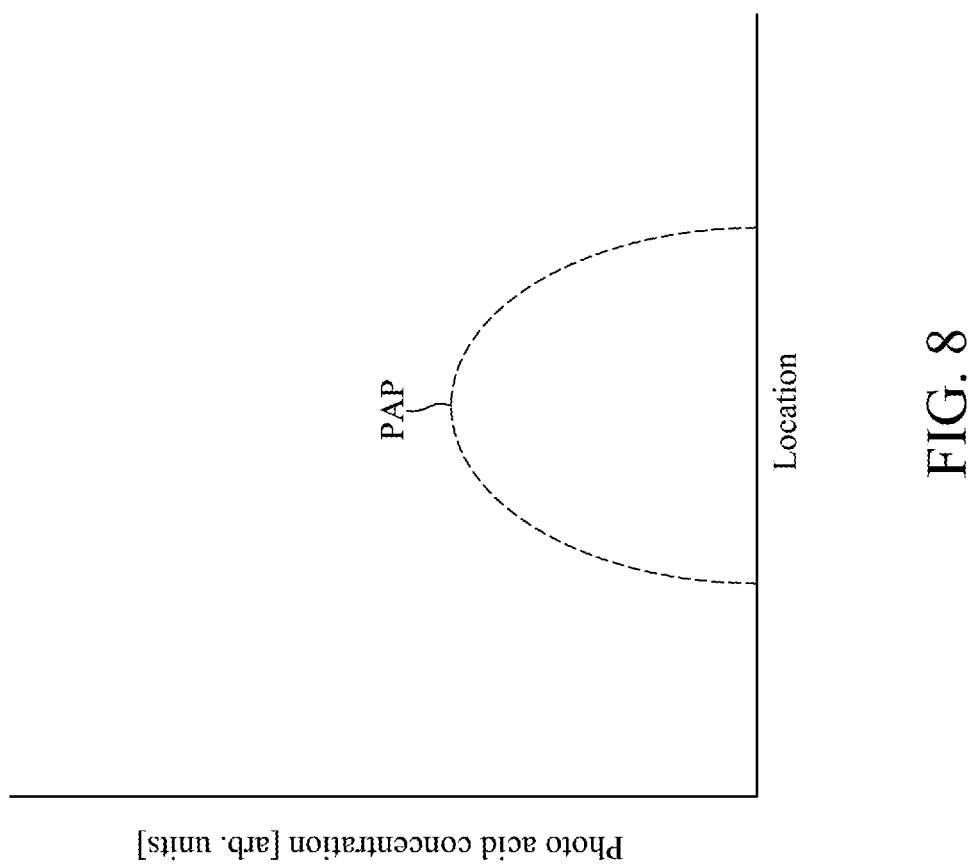
FIG. 8 shows the exemplary photoacid concentration profile in FIG. 7 in accordance with one embodiment of the present disclosure.

FIG. 7 illustrates, in a schematic cross-sectional view diagram, part of the flow for measuring the critical dimension of the semiconductor device 1A in accordance with one embodiment of the present disclosure. FIG. 8 shows the exemplary photoacid concentration profile in FIG. 7 in accordance with one embodiment of the present disclosure. FIG. 9 is a concentration curve representing the volatile gas generated from the resist layer 201 measured by a gas analyzer.

With reference to FIG. 1 and FIGS. 7 to 9, at step S21, a post-exposure bake process may be performed, the volatile byproduct generated from the resist layer 201 may be monitored, and the critical dimension may be determined according to the monitoring results.

With reference to FIGS. 7 and 8, the post-exposure bake (PEB) process may be immediately performed after the exposure process 300. During the post-exposure bake process, the intermediate semiconductor device illustrated in FIG. 5 may be subjected to a temperature on the order of the glass-transition temperature Tg of the nonactivated polymer resin. Thermal energy applied to the resist layer 201 during the post-exposure bake process may cause the photoacid to diffuse within the resist layer 201 to form the photoacid concentration profile PAP as shown enlarged in FIG. 8. The diffusion of the photoacid may fully activate the nonactivated resin in regions exposed to the radiation source, and may also dampen any standing wave effects at the edges of exposed regions of the resist layer 201. The exemplary activation reaction is shown in equation (2) to equation (4).

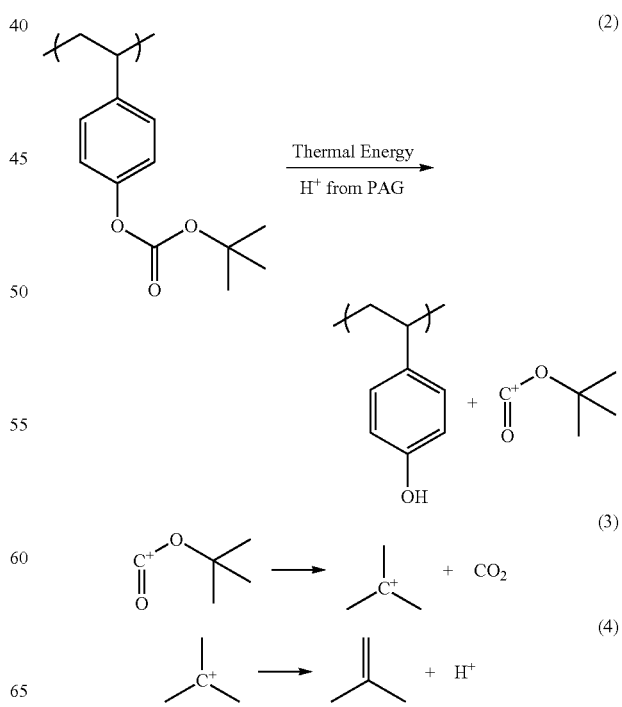

In equation (2), the photoacid may cause conversion of the nonactivated polymer resin (insoluble) into a soluble product comprising polar hydroxyl group. The unstable leaving group may spontaneously decompose and byproducts such carbon dioxide, isobutene, and proton may be produced as shown in equation (3) and equation (4). The resulting proton from the decomposition of the leaving group may further catalyze the conversion of the nonactivated polymer resin. In some other embodiments, other byproducts may be also produced during the post-exposure bake process such as propylene glycol monomethyl ether acetate, water, carbon dioxide, alcohols, volatile amine-containing compounds, hydrocarbons, aldehydes, and/or vinyl ether.

With reference to FIG. 9, the concentration of the reaction byproduct (e.g., carbon dioxide in the exemplary reaction) may be monitored as a function of time to determine the endpoint of the post-exposure bake process. For example, as the activation reaction reaches a process endpoint, the byproduct levels may drop, enabling the endpoint of the post-exposure bake process to be detected. In other words, the process duration of the post-exposure bake process is based on chemical changes occurring instead of a fixed process time. For another example, the end point of the post-exposure bake process may be determined by concentration rate of change (i.e., slope of concentration curve or first order derivative of the concentration curve), 2nd order rate of change (i.e., second order derivative of concentration curve), or a combination thereof. The timing for monitoring the volatile byproduct when the endpoint of the post-exposure bake process is reached may be referred to as the second monitoring of the volatile byproduct.

In some embodiments, the difference between the concentrations measured at the first monitoring and the second monitoring of the volatile byproduct may be used to deduct the critical dimension of the patterned resist layer 201 after the development process as will be illustrated later.

In some embodiments, after the post-exposure bake process, a cooling process may be performed to cool the intermediate semiconductor device illustrated in FIG. 7. The volatile byproduct may be monitored after the cooling process. The timing for monitoring the volatile byproduct after the cooling process may be referred to as the third monitoring of the volatile byproduct.

In some embodiments, the volatile byproduct may be continuously monitored from the first monitoring of the volatile byproduct to the third monitoring of the volatile byproduct. The integration of the concentration curve from the first monitoring of the volatile byproduct to the third monitoring of the volatile byproduct may be used to deduct the critical dimension of the patterned resist layer 201 after the development process.

In some embodiments, depending upon the chemically amplified photoresist systems utilized, activation of the polymer resin can occur predominantly either during the exposure process 300 or the post-exposure bake process. Some chemically amplified photoresists, such as the T-Boc protected polymer resin described in the exemplary activation reaction, are high activation energy systems. This means that even after photoacid ($H^+$) is generated by the photoacid generator during the exposure process 300, additional thermal energy is required to initiate activation. This thermal energy is provided by the post-exposure bake process. In such a situation, the monitoring of the volatile byproduct may be performed before the exposure process 300 (e.g., the first monitoring of the volatile byproduct) and after the post-exposure bake process (e.g., the second or third monitoring of the volatile byproduct).

In some embodiments, other chemically amplified photoresist systems, such as those utilizing acetal protection, are low activation energy systems. This means that once photoacid ($H^+$) is generated during the exposure process 300 by the photoacid generator, significant activation of the polymer resin takes place even in the absence of additional thermal energy. In such a situation, the monitoring of the volatile byproduct may be performed before the exposure process 300 and after the exposure process 300.

It should be noted that the concentration curve of FIG. 9 is provided for illustrative purposes and does not necessarily represent an actual concentration curve. An actual concentration curve will vary depending on the specific pattern being formed in the resist layer 201, the specific type of photoresist being used, and the thickness of the resist layer 201, etc.

Figure 10:
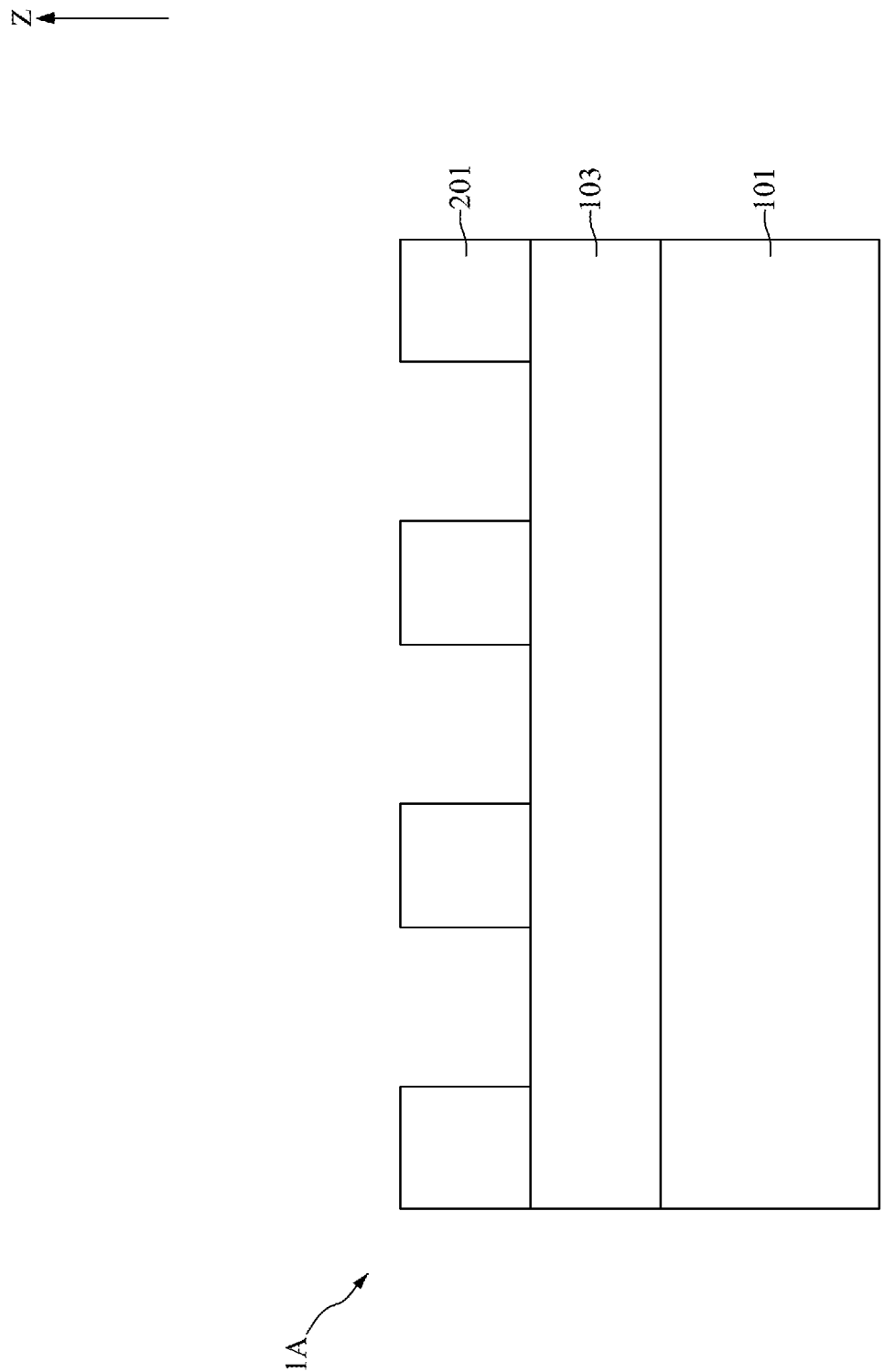
FIG. 10 illustrates, in a schematic cross-sectional view diagram, part of the flow for measuring the critical dimension of the semiconductor device in accordance with one embodiment of the present disclosure.

FIG. 10 illustrates, in a schematic cross-sectional view diagram, part of the flow for measuring the critical dimension of the semiconductor device 1A in accordance with one embodiment of the present disclosure.

With reference to FIGS. 1 and 10, at step S23, a development process may be performed.

With reference to FIG. 10, during the development process, an aqueous base solution may be added to the exposed and baked resist layer 201, and a portion of the resin may be dissolved. Depending upon whether the chemically amplified photoresist system is positive or negative, either activated or nonactivated polymer resin may be dissolved in the aqueous base and removed.

After aforementioned processing, the carefully created photoresist pattern on the resist layer 201 may serve to selectively mask etching of the underlying layer (e.g., the under layer 103) to form semiconducting structures having extremely precise shapes and sizes.

Conventionally, the critical dimension (CD) measurement is achieved by scanning electron microscope (SEM) using electron beams. However, the electron beams will damage the photoresist so that the CD-SEM measurement can only be performed on the dummy marks, which are specially designed for mythology, located on the scribe lines. In other words, the CD-SEM cannot measure the CD of a real pattern within a function circuit. In addition, the ArF immersion (ArFi) photolithography using a chemically amplified photoresist system is more vulnerable to electron beams. The CD may significantly shrink during initial measurements to generate great deviation of CD measurement. As a result, the real CD (before damage) is hard to determine.

In contrast, determining the CD of the patterned resist layer 201 by using the different between the concentrations measured at the first monitoring and the second monitoring of the volatile byproduct or by using the integration of the concentration curve from the first monitoring of the volatile byproduct to the third monitoring of the volatile byproduct may be non-destructive to the pattern. That is, the CD of the real pattern can be measured. It may also imply that no dummy mark for measuring is needed so that real estate for metrology may be saved and more space may be provided for functional circuits.

In addition, the CD of the real pattern may be validated by physical failure analysis (PFA) such as transmission electron microscope (TEM). After validation of PFA, the correlation between TEM data and CD determined by monitoring of the volatile byproduct may be established. In such a situation, the CD determined by monitoring of the volatile byproduct may be solely used as the criteria of CD measuring. As a result, the throughput of CD measuring may be increased.

In some embodiments, the residual gas analyzer may be small enough to only collect volatile gas within a specific area. The area may be a region containing a real pattern within a die, a single die region within a wafer, some dies within a wafer, or the whole wafer.

In some embodiments, the spin coating process, the soft bake process, the exposure process 300, the post-exposure bake process, and the development process may be performed in a photolithography track system. The residual gas analyzer may be integrated within the post-exposure bake module of the photolithography track system. For example, the residual gas analyzer may be mounted anywhere along the exhaust line of the photolithography track system, coupled to the exhaust pipe of the photolithography track system.

Figure 11:
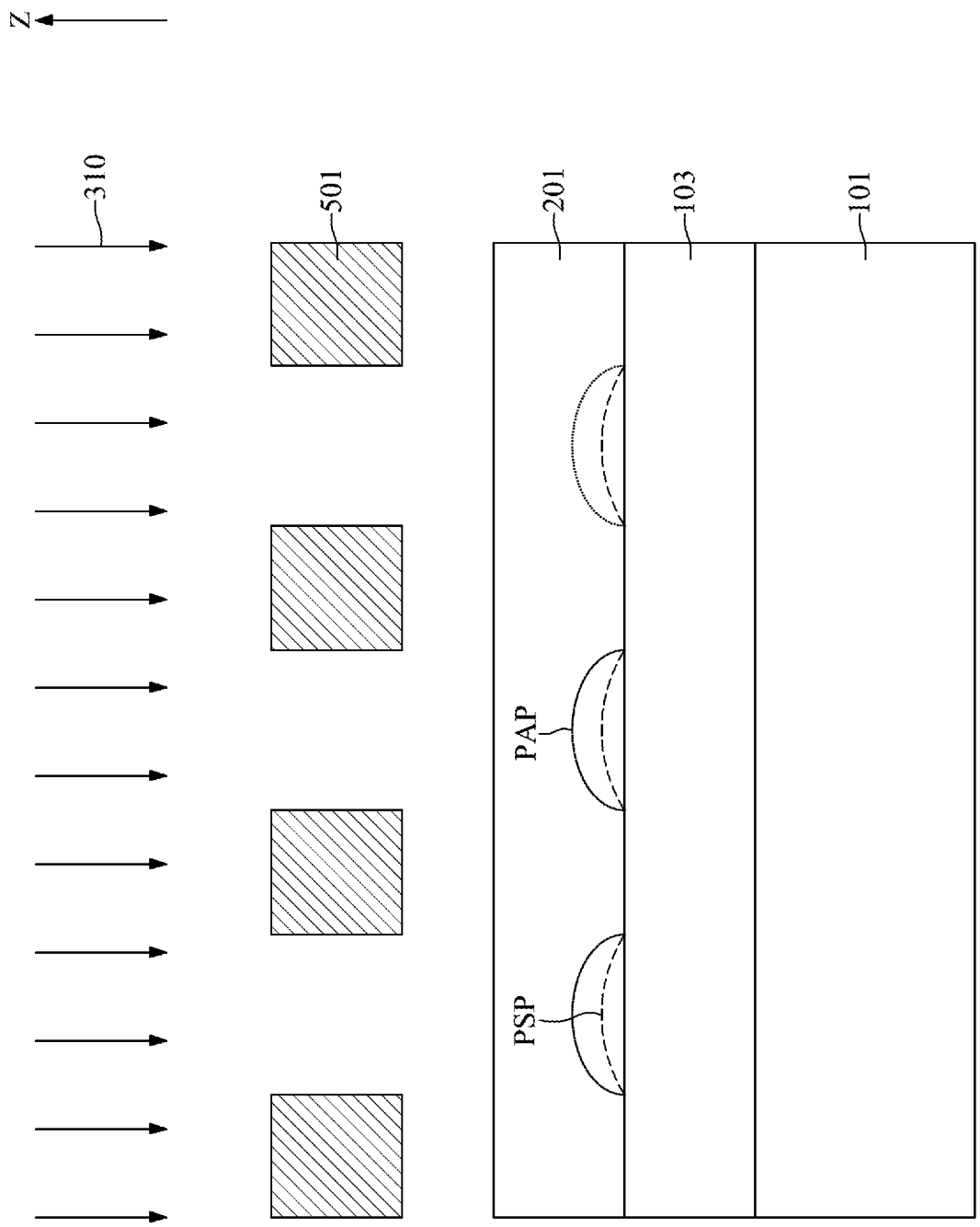
FIG. 11 illustrates, in a schematic cross-sectional view diagram, part of a flow for measuring critical dimension of a semiconductor device in accordance with another embodiment of the present disclosure.
Figure 12:
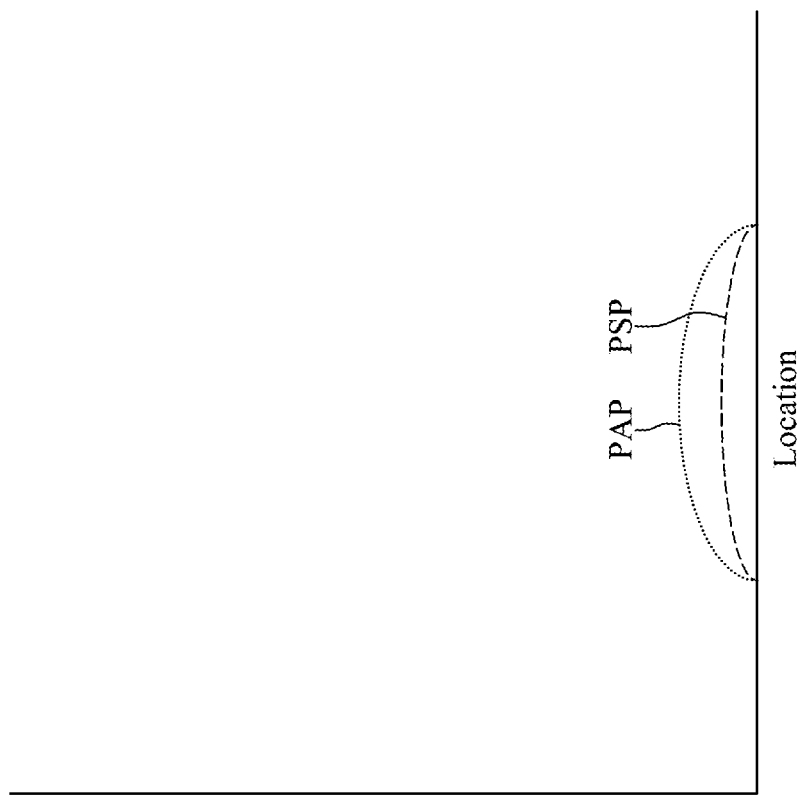
FIG. 12 shows an exemplary photoacid concentration profile and an exemplary photosensitizer concentration profile in FIG. 11 in accordance with another embodiment of the present disclosure.

FIG. 11 illustrates, in a schematic cross-sectional view diagram, part of a flow for measuring critical dimension of a semiconductor device 1B in accordance with another embodiment of the present disclosure. FIG. 12 shows an exemplary photoacid concentration profile and an exemplary photosensitizer concentration profile in FIG. 11 in accordance with another embodiment of the present disclosure.

With reference to FIG. 11, the resist layer 201 may include nonactivated polymer resin, a photoacid generator, and a photosensitizer generator. The nonactivated polymer resin, the photoacid generator, and the photosensitizer generator together configure a photo-sensitized chemically amplified photoresist system which requires a two-step illumination process to generate photoacid.

With reference to FIGS. 11 and 12, in the photo-sensitized chemically amplified photoresist system, a first exposure process 310 may be performed. During the first exposure process 310, a radiation source in a first wavelength may be exposed onto the resist layer 201 through a mask 501, to form exposed and unexposed regions inside the resist layer 201. During the first exposure process 310, photosensitizer (PS) is generated from the photosensitizer generator in exposed regions of the resist layer 201, to form the photosensitizer concentration profile PSP, which is shown enlarged in FIG. 12.

Depending on the chemistry of the photo-sensitized chemically amplified photoresist system, in some embodiments, photoacid may be formed during the first exposure process 310 from the photoacid generators inside the exposed regions of the resist layer 201, to form the photoacid concentration profile PAP, which is shown enlarged in FIG. 12. In such a situation, the monitoring of the volatile byproduct may be performed (or started) before the first exposure 310.

In other embodiments, where there is no overlap between the light sensitivity range of the photosensitizer generator and the light sensitivity range of the photoacid generator so that no photoacid is generated during the first exposure process 310. In such a situation, the monitoring of the volatile byproduct may be performed (or started) after the first exposure 310.

In some embodiments, electron beam (eBeam), KrF, or ArF exposure may also be used for the first exposure process 310.

Figure 13:
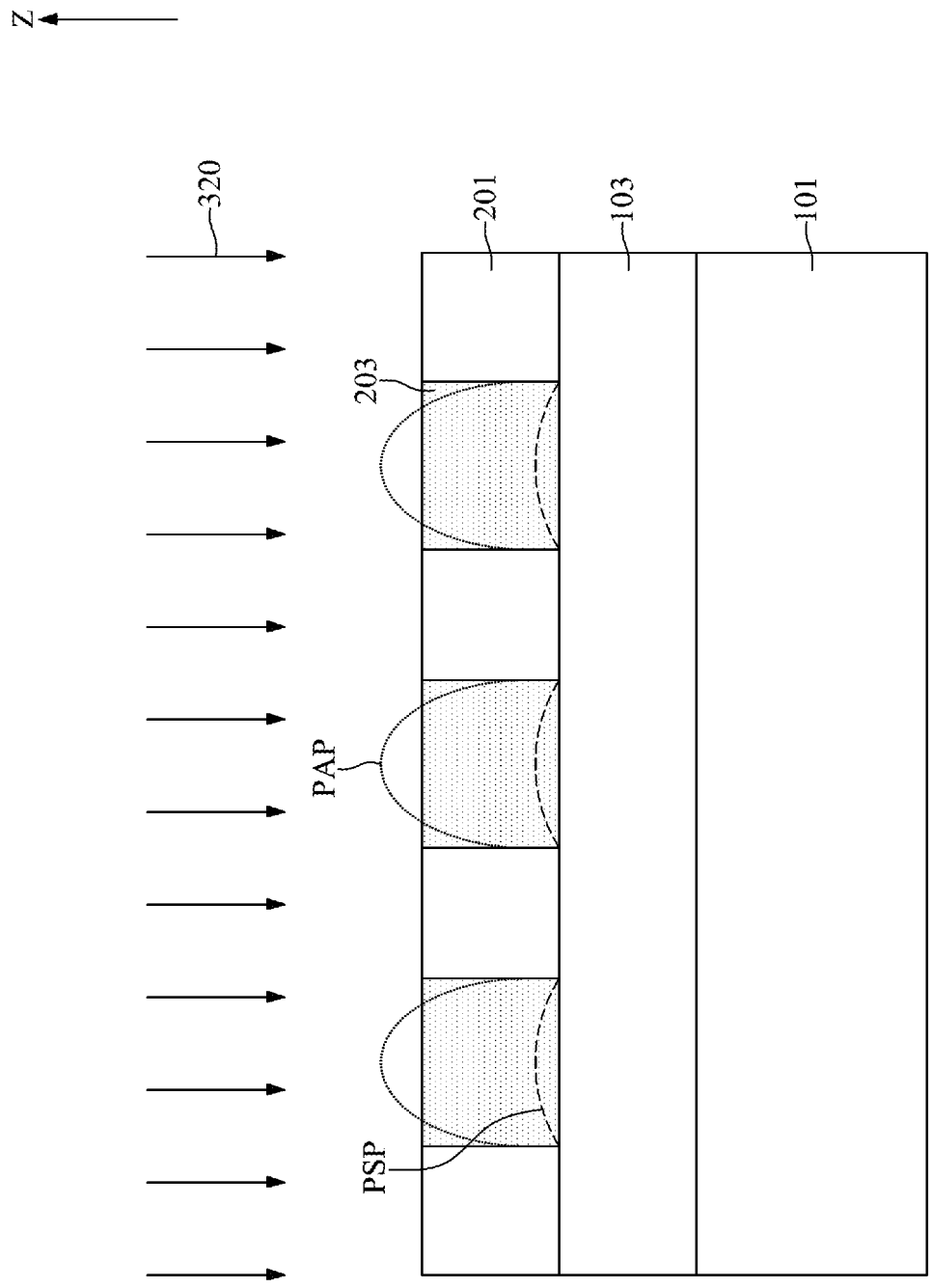
FIG. 13 illustrates, in a schematic cross-sectional view diagram, part of the flow for measuring the critical dimension of the semiconductor device in accordance with another embodiment of the present disclosure.
Figure 14:
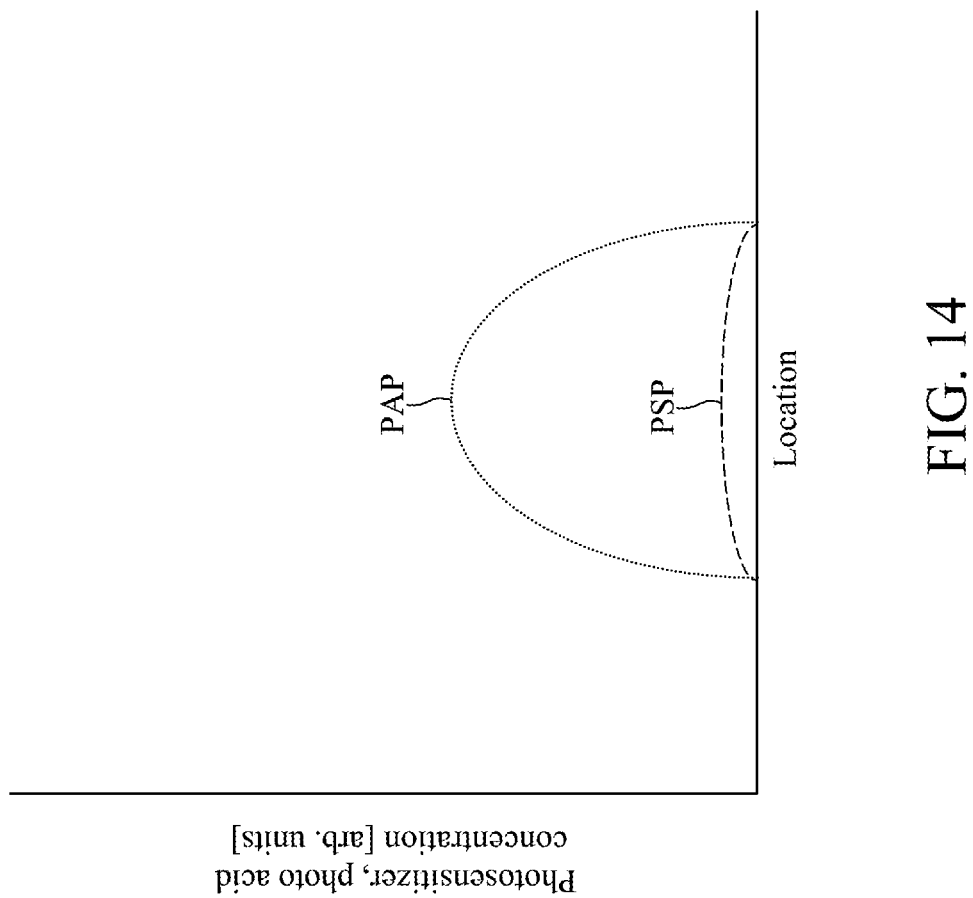
FIG. 14 shows the exemplary photoacid concentration profile and the exemplary photosensitizer concentration profile in FIG. 13 in accordance with another embodiment of the present disclosure.

FIG. 13 illustrates, in a schematic cross-sectional view diagram, part of the flow for measuring the critical dimension of the semiconductor device 1B in accordance with another embodiment of the present disclosure. FIG. 14 shows the exemplary photoacid concentration profile and the exemplary photosensitizer concentration profile in FIG. 13 in accordance with another embodiment of the present disclosure.

With reference to FIGS. 13 and 14, a second exposure process 320 may be performed to the resist layer 201. During the second exposure process 320, a radiation source in a second wavelength different from the first wavelength may be exposed onto the resist layer 201 without any mask. In other words, the second exposure process 320 is a flood exposure. The chemistry of the photo-sensitized chemically amplified photoresist system is chosen such that the photosensitizer is sensitive to the second wavelength used in the second exposure process 320, while other resist components are not. Therefore, the radiation source in the second wavelength may cause photosensitizer generated in previously exposed (i.e., unmasked) regions to amplify photoacid generation from photoacid generator molecules in their vicinity, thereby forming the photoacid concentration profile PAP in FIG. 14. The photoacid concentration profile PAP has higher peaks and therefore a better contrast.

It should be noted that even though a flood exposure (i.e., the second exposure process 320) is involved, unlike in traditional flood exposure processing there is no generation of photoacid in regions that were unexposed (masked) during the first exposure process 310, thus there is no DC-bias, and a high contrast is maintained. This is because, in the photo-sensitized chemically amplified photoresist system, photoacid generation and amplification occur only in the presence of the photosensitizer.

The photosensitizer concentration profile PSP may undergo little change after the second exposure process 320 from the photosensitizer concentration profile PSP in FIG. 12, but in certain chemistry embodiments, larger changes may occur.

In some embodiments, the first wavelength may be less than 300 nm while the second wavelength may be greater than 300 nm, or about 365 nm.

In some embodiments, additional heating or baking process may be inserted between the first exposure process 310 and the second exposure process 320 to mitigate extreme ultraviolet shot noise effects of the first exposure process 310. For example, a heating process may be utilized between the first exposure process 310 and the second exposure process 320, to diffuse the photosensitizer and smooth the photosensitizer concentration profile PSP affected by the extreme ultraviolet shot noise effect.

Figure 15:
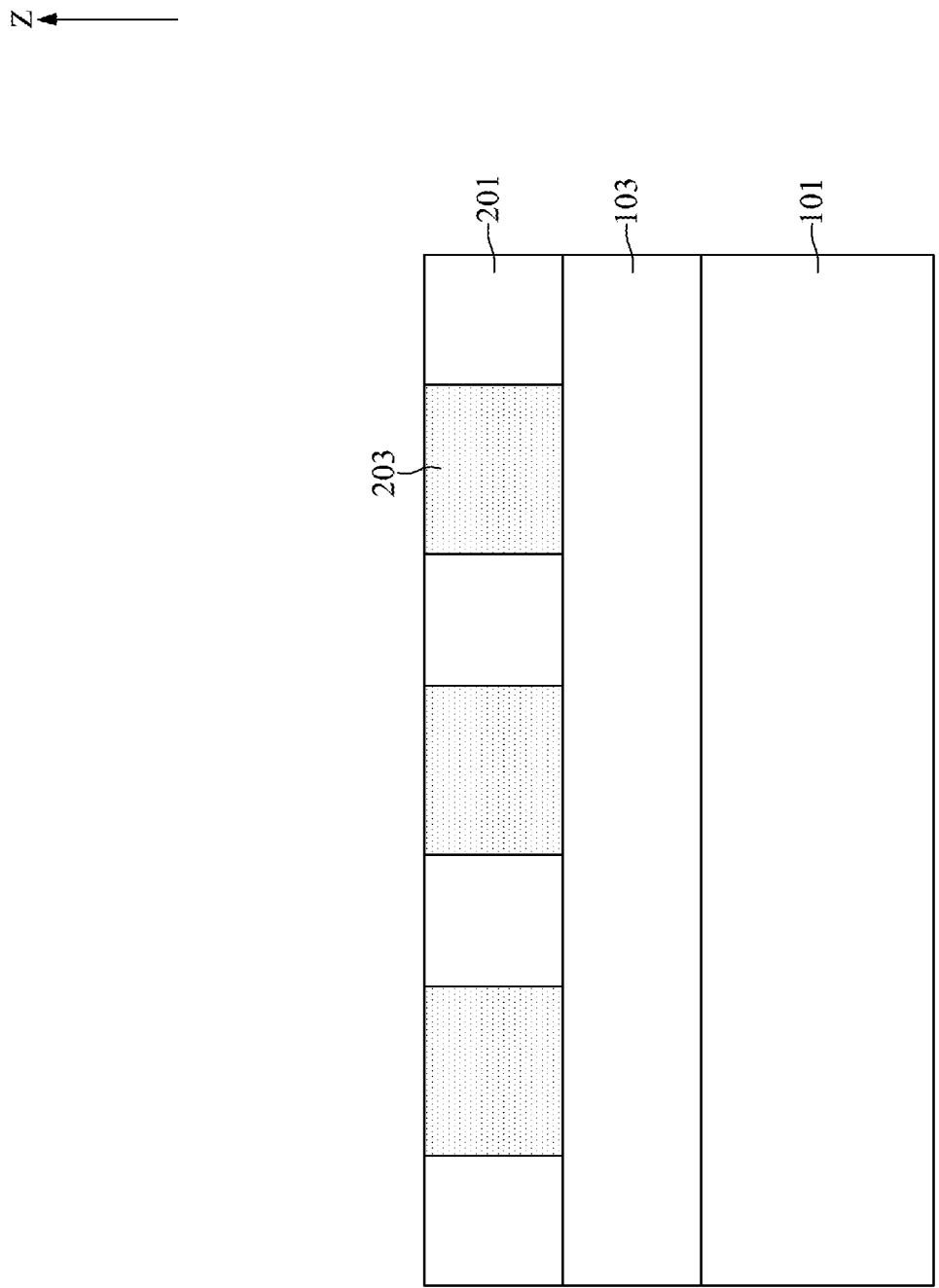
FIGS. 15 and 16 illustrate, in schematic cross-sectional view diagrams, part of the flow for measuring the critical dimension of the semiconductor device in accordance with another embodiment of the present disclosure.
Figure 16:
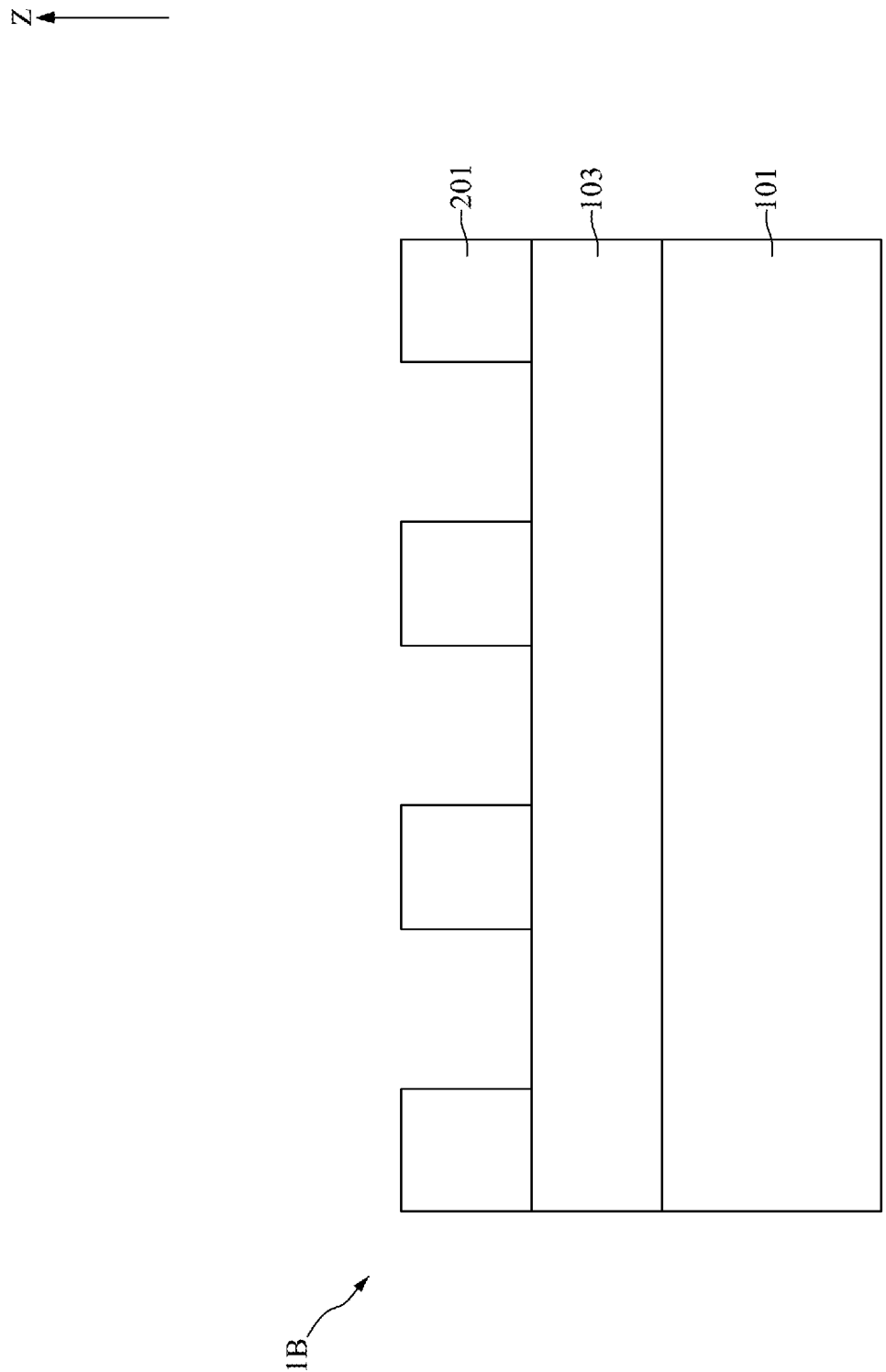

FIGS. 15 and 16 illustrate, in schematic cross-sectional view diagrams, part of the flow for measuring the critical dimension of the semiconductor device 1B in accordance with another embodiment of the present disclosure.

With reference to FIG. 15, a post-exposure bake process may be performed with a procedure similar to that illustrated in FIG. 7, and descriptions thereof are not repeated herein. The post-exposure bake process may further activate the conversion of the nonactivated polymer resin. In such a situation, the monitoring of the volatile byproduct may be performed (or ended) after the post-exposure bake process or the cooling process.

In some embodiments, the post-exposure bake process may be omitted when employing the photo-sensitized chemically amplified photoresist system. In such a situation, the monitoring of the volatile byproduct may be performed (or ended) after the second exposure process 320.

With reference to FIG. 16, the development process may be performed with a procedure similar to that illustrated in FIG. 10, and descriptions thereof are not repeated herein.

One aspect of the present disclosure provides a method for measuring critical dimension including providing a substrate; forming a resist layer over the substrate; monitoring a volatile byproduct evolved from the resist layer to obtain a first amount of the volatile byproduct; exposing the resist layer to a radiation source; heating the resist layer; monitoring the volatile byproduct evolved from the resist layer to obtain a second amount of the volatile byproduct; and deducting the critical dimension according to a difference between the first amount of the volatile byproduct and the second amount of the volatile byproduct.

Another aspect of the present disclosure provides a method for measuring critical dimension including providing a substrate; forming a resist layer over the substrate; exposing the resist layer to a radiation source; heating the resist layer; continuously monitoring a volatile byproduct evolved from the resist layer from a first time point after forming the resist layer over the substrate to a second time point after heating the resist layer, to obtain a concentration curve of the volatile byproduct; and deducting the critical dimension according to an integration of the concentration curve between the first time point and the second time point.

Another aspect of the present disclosure provides a method for measuring critical dimension including providing a substrate; forming a resist layer over the substrate and including a solvent, a nonactivated polymer resin, a photoacid generator, and a photosensitizer generator; exposing the resist layer to a radiation source in a first wavelength; exposing the resist layer to a radiation source in a second wavelength different from the first wavelength; heating the resist layer; continuously monitoring a volatile byproduct evolved from the resist layer from a first time point after forming the resist layer over the substrate to a second time point after heating the resist layer, to obtain a concentration curve of the volatile byproduct; and deducting the critical dimension according to an integration of the concentration curve between the first time point and the second time point. The photosensitizer generator is sensitive to the second wavelength and the photoacid generator is not sensitive to the second wavelength.

Due to the design of the method for measuring critical dimension of the present disclosure, the critical dimension of the real pattern may be measured without any damage by monitoring the volatile byproduct evolved from the resist layer 201. Furthermore, no dummy mark for metrology is needed. Those areas previously occupied by the dummy marks for metrology may be saved. As a result, more real estate may be provided for functional circuits so that the cost may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for measuring critical dimension, comprising:
    providing a substrate;
    forming a resist layer over the substrate, wherein the resist layer comprises a solvent, a nonactivated polymer resin, a photoacid generator, and a photosensitizer generator;
    exposing the resist layer to a radiation source in a first wavelength;
    exposing the resist layer to a radiation source in a second wavelength different from the first wavelength;
    heating the resist layer;
    continuously monitoring a volatile byproduct evolved from the resist layer from a first time point after forming the resist layer over the substrate to a second time point after heating the resist layer, to obtain a concentration curve of the volatile byproduct; and
    deducting the critical dimension according to an integration of the concentration curve between the first time point and the second time point;
    wherein the photosensitizer generator is sensitive to the second wavelength and the photoacid generator is not sensitive to the second wavelength.

2. The method for measuring critical dimension of claim 1, wherein the first wavelength is less than 300 nm, and the second wavelength is greater than 300 nm.

3. The method for measuring critical dimension of claim 2, wherein the solvent comprises propylene glycol monomethyl ether acetate, water, or a volatile amine-containing compound.

4. The method for measuring critical dimension of claim 1, wherein the volatile byproduct comprises carbon dioxide, propylene glycol monomethyl ether acetate, water, alcohols, volatile amine-containing compounds, hydrocarbons, aldehydes, vinyl ether, and/or sulfides.

5. The method for measuring critical dimension of claim 4, further comprising performing a soft bake process between forming the resist layer over the substrate and exposing the resist layer to the radiation source in the first wavelength.

6. The method for measuring critical dimension of claim 5, wherein performing the soft bake process comprising heating the resist layer to about a glass-transition temperature of the nonactivated polymer resin.

7. The method for measuring critical dimension of claim 6, wherein continuously monitoring the volatile byproduct evolved from the resist layer is achieved by a residual gas analyzer.

8. The method for measuring critical dimension of claim 7, wherein the residual gas analyzer is integrated within a post-exposure bake module of a photolithography track system.

9. The method for measuring critical dimension of claim 8, further comprising correlating the critical dimension deducted from integration of the concentration curve between the first time point and the second time point with physical failure analysis results.

10. The method for measuring critical dimension of claim 9, further comprising performing a development process after heating the resist layer.

* * * * *